(12) United States Patent
Hillabrand et al.

(10) Patent No.: US 8,951,352 B2
(45) Date of Patent: *Feb. 10, 2015

(54) MANUFACTURING APPARATUS FOR DEPOSITING A MATERIAL AND AN ELECTRODE FOR USE THEREIN

(75) Inventors: David Hillabrand, Midland, MI (US); Theodore Knapp, Midland, MI (US)

(73) Assignee: Hemlock Semiconductor Corporation, Hemlock, MI (US)

( * ) Notice: Subject to any disclaimer, the term of this patent is extended or adjusted under 35 U.S.C. 154(b) by 882 days.

This patent is subject to a terminal disclaimer.

(21) Appl. No.: 12/937,802

(22) PCT Filed: Apr. 13, 2009

(86) PCT No.: PCT/US2009/002294
§ 371 (c)(1),
(2), (4) Date: Oct. 14, 2010

(87) PCT Pub. No.: WO2009/128888
PCT Pub. Date: Oct. 22, 2009

(65) Prior Publication Data
US 2011/0036294 A1   Feb. 17, 2011

Related U.S. Application Data

(60) Provisional application No. 61/044,687, filed on Apr. 14, 2008.

(51) Int. Cl.
*H01L 21/306* (2006.01)
*C23C 16/50* (2006.01)
(Continued)

(52) U.S. Cl.
CPC .............. *C23C 16/4418* (2013.01); *H05B 3/03* (2013.01); *H01R 13/005* (2013.01); *C01B 33/035* (2013.01)
USPC ..................................... 118/728; 156/345.51

(58) Field of Classification Search
CPC .................................................... C01B 33/035

USPC ......... 118/715, 728–733; 156/345.51–345.55
See application file for complete search history.

(56) References Cited

U.S. PATENT DOCUMENTS 2,999,735 A    9/1961   Reuschel
3,011,877 A    12/1961  Schweickert et al.
(Continued)

FOREIGN PATENT DOCUMENTS

DE     1264400 B    3/1968
FR     2741227 A1   5/1997
(Continued)

OTHER PUBLICATIONS

Germany Patent No. DE 1264400 extracted from espacenet.com database Mar. 29, 2011, no English translation available 4 pages.
(Continued)

*Primary Examiner* — Maureen Gramaglia
*Assistant Examiner* — Tiffany Nuckols
(74) *Attorney, Agent, or Firm* — Cantor Colburn LLP

(57) ABSTRACT

A manufacturing apparatus and an electrode for use with the manufacturing apparatus are provided for deposition of a material on a carrier body. Typically, the carrier body has a first end and a second end spaced from each other. A socket is disposed at each end of the carrier body. The manufacturing apparatus includes a housing that defines a chamber. At least one electrode is disposed through the housing with the electrode at least partially disposed within the chamber for coupling to the socket. The electrode has an exterior surface having a contact region that is adapted to contact the socket. An exterior coating is disposed on the exterior surface of the electrode, outside of the contact region. The exterior coating has an electrical conductivity of at least $9 \times 10^6$ Siemens/meter and a corrosion resistance that is higher than silver in a galvanic series that is based upon room temperature sea water as an electrolyte.

13 Claims, 5 Drawing Sheets

(51) Int. Cl.
*C23F 1/00* (2006.01)
*C23C 16/00* (2006.01)
*H05B 3/03* (2006.01)
*H01R 13/00* (2006.01)
*C01B 33/035* (2006.01)
*C23C 16/44* (2006.01)

(56) References Cited

U.S. PATENT DOCUMENTS

| | | |
|---|---|---|
| 3,057,690 A | 10/1962 | Reuschel et al. |
| 3,058,812 A | 10/1962 | Chu et al. |
| 3,147,141 A | 9/1964 | Ishizuka |
| 3,152,933 A | 10/1964 | Reuschel |
| 3,330,251 A | 7/1967 | Gutsche |
| 3,918,396 A | 11/1975 | Dietze et al. |
| 4,062,714 A | 12/1977 | Griesshammer et al. |
| 4,141,764 A | 2/1979 | Authier et al. |
| 4,147,814 A | 4/1979 | Yatsurugi et al. |
| 4,150,168 A * | 4/1979 | Yatsurugi et al. ............ 427/588 |
| 4,173,944 A | 11/1979 | Koppl et al. |
| 4,179,530 A | 12/1979 | Koppl et al. |
| 4,304,641 A | 12/1981 | Grandia et al. |
| 4,311,545 A | 1/1982 | Bugl et al. |
| 4,466,864 A * | 8/1984 | Bacon et al. ................. 205/105 |
| 4,477,911 A | 10/1984 | Racki |
| 4,481,232 A | 11/1984 | Olson |
| 4,707,225 A | 11/1987 | Schuler et al. |
| 4,766,349 A | 8/1988 | Johansson et al. |
| 4,805,556 A | 2/1989 | Hagan et al. |
| 4,822,641 A | 4/1989 | Weik |
| 5,096,550 A | 3/1992 | Mayer et al. |
| 5,227,041 A | 7/1993 | Brogden et al. |
| 5,422,088 A | 6/1995 | Burgie et al. |
| 5,438,175 A | 8/1995 | Herklotz et al. |
| 5,447,615 A | 9/1995 | Ishida |
| 5,567,300 A | 10/1996 | Datta et al. |
| 5,593,465 A | 1/1997 | Seifert et al. |
| 5,807,165 A | 9/1998 | Uzoh et al. |
| 5,906,799 A | 5/1999 | Burgie et al. |
| 5,911,619 A | 6/1999 | Uzoh et al. |
| 6,004,880 A | 12/1999 | Liu et al. |
| 6,176,992 B1 | 1/2001 | Talich |
| 6,221,155 B1 * | 4/2001 | Keck et al. .................... 117/200 |
| 6,225,602 B1 | 5/2001 | Buijze et al. |
| 6,284,312 B1 | 9/2001 | Chandra et al. |
| 6,639,192 B2 | 10/2003 | Hertlein et al. |
| 7,045,045 B2 * | 5/2006 | Natsuhara et al. ....... 204/297.06 |
| 7,083,701 B2 | 8/2006 | Ohmi et al. |
| 2002/0024277 A1 | 2/2002 | Fuchs et al. |
| 2002/0106944 A1 * | 8/2002 | Miyanoo et al. ............. 439/886 |
| 2003/0021894 A1 | 1/2003 | Inoue et al. |
| 2007/0251455 A1 | 11/2007 | Wan et al. |

FOREIGN PATENT DOCUMENTS

| | | |
|---|---|---|
| GB | 1054141 A | 1/1967 |
| JP | 2001077097 A | 3/2001 |
| JP | 2001156042 A | 6/2001 |
| JP | 2002355550 A | 12/2002 |
| JP | 2003-040612 | 2/2003 |
| JP | 2004-205059 | 7/2004 |
| JP | 2005-272965 | 10/2005 |
| JP | 2006016243 A | 1/2006 |
| JP | 2007281161 A | 10/2007 |
| RU | 2135629 C1 | 8/1999 |
| WO | WO 01-60121 A1 | 8/2001 |
| WO | WO 03-107720 A1 | 12/2003 |
| WO | 2007136209 A1 | 11/2007 |
| WO | WO 2009-128886 A1 | 10/2009 |
| WO | WO 2009-128887 A1 | 10/2009 |

OTHER PUBLICATIONS

English language abstract for FR 2741227 extracted from espacenet.com database Mar. 29, 2011, 13 pages.
English language translational and abstract for JP 2004-205059 extracted from PAJ database Mar. 29, 2011, 21 pages.
English language abstract for WO 01-60121 extracted from espacenet.com database dated Mar. 29, 2011, 16 pages.
PCT International Search Report for PCT/US2009/002293, dated Jul. 14, 2009, 3 pages.
PCT International Search Report for PCT/US2009/002294, dated Jul. 10, 2009, 3 pages.
PCT International Search Report for PCT/US2009/002289, dated Jul. 7, 2009, 4 pages.
Publication: Maex et al. "Properties of Metal Silicides", INSPEC, 1995, Chapter 7, 32 pages.
English language abstract for RU 2135629 extracted from the espacenet.com database on May 21, 2013, 2 pages.
Office Action regarding related JP Application No. 2011-505007; dated Nov. 12, 2013; 6 pgs.
Japanese Patent No. 2001077097 A; Date of Publication: Mar. 23, 2001; Abstract Only, 2 pages.
Japanese Patent No. 2006016243 A; Date of Publication: Jan. 19, 2006; Abstract Only, 2 pages.
Japanese Patent No. 2007281161 A; Date of Publication: Oct. 25, 2007; Abstract Only, 1 page.

* cited by examiner

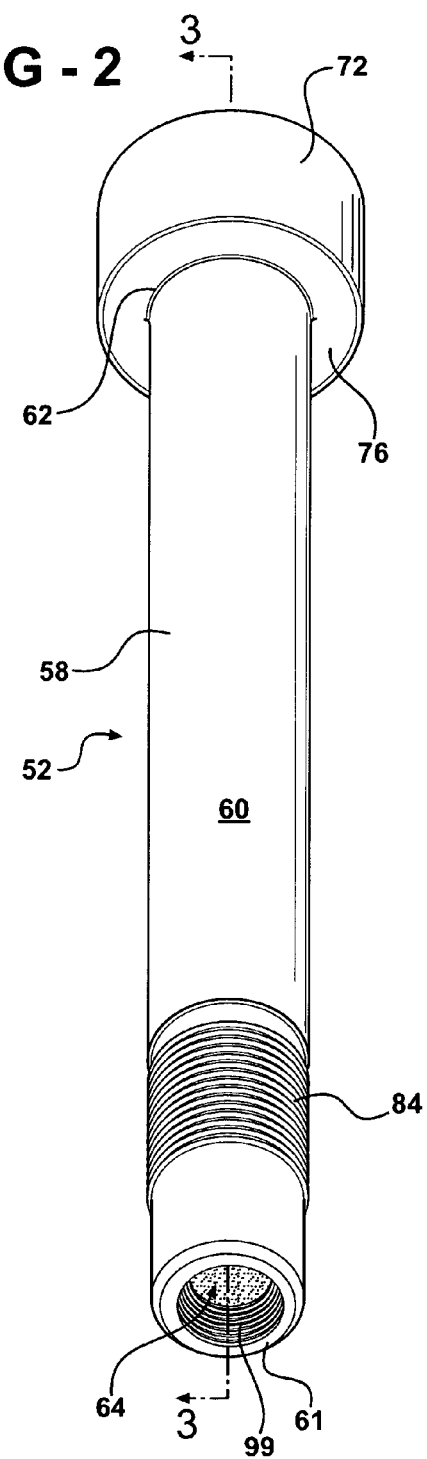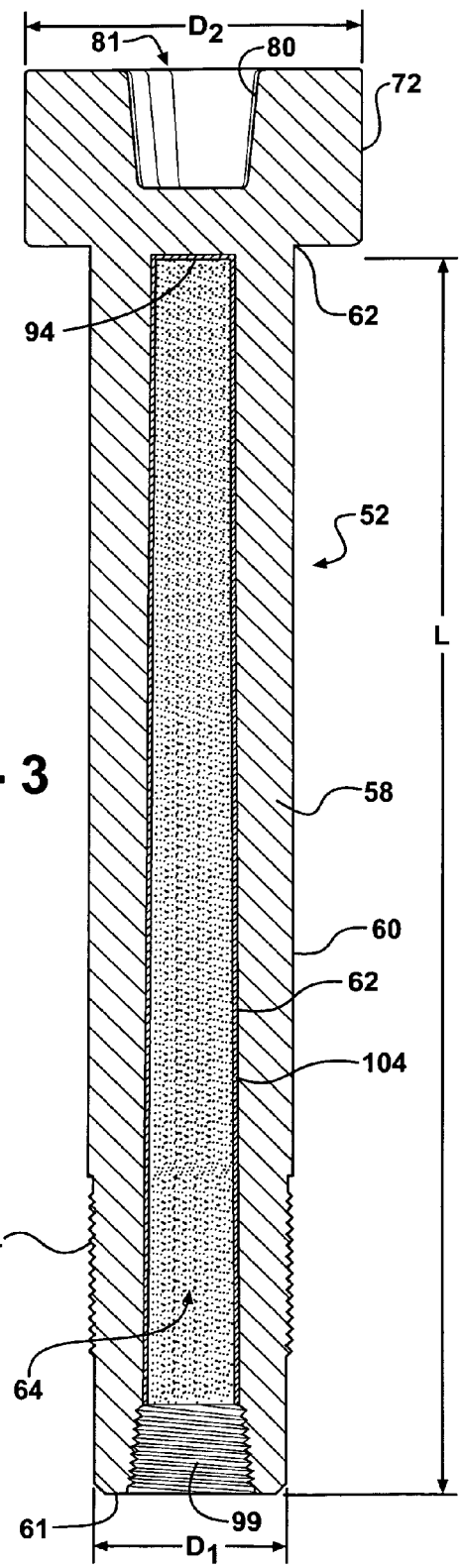

MANUFACTURING APPARATUS FOR DEPOSITING A MATERIAL AND AN ELECTRODE FOR USE THEREIN

RELATED APPLICATIONS

This application claims priority to and all advantages of PCT International Patent Application No. PCT/US09/02294, filed on Apr. 13, 2009, and U.S. Provisional Patent Application No. 61/044,687, which was filed on Apr. 14, 2008.

FIELD OF THE INVENTION

The present invention relates to a manufacturing apparatus. More specifically, the present invention relates to an electrode utilized within the manufacturing apparatus.

BACKGROUND OF THE INVENTION

Manufacturing apparatuses for the deposition of a material on a carrier body are known in the art. Such manufacturing apparatuses comprise a housing that defines a chamber. Generally, the carrier body is substantially U-shaped having a first end and a second end spaced from each other. Typically, a socket is disposed at each end of the carrier body. Generally, two or more electrodes are disposed within the chamber for receiving the respective socket disposed at the first end and the second end of the carrier body, respectively. The electrode also includes a contact region, which supports the socket and, ultimately, the carrier body to prevent the carrier body from moving relative to the housing. The contact region is the portion of the electrode adapted to be in direct contact with the socket and that provides a primary current path from the electrode to the socket and into the carrier body.

A power supply device is coupled to the electrode for supplying an electrical current to the carrier body. The electrical current heats both the electrode and the carrier body. The electrode and the carrier body each have a temperature with the temperature of the carrier body being heated to a deposition temperature. A processed carrier body is formed by depositing the material on the carrier body.

As known in the art, variations exist in the shape of the electrode and the socket to account for thermal expansion of the material deposited on the carrier body as the carrier body is heated to the deposition temperature. One such method utilizes a flat head electrode and a socket in the form of a graphite sliding block. The graphite sliding block acts as a bridge between the carrier body and the flat head electrode. The weight of the carrier body and the graphite sliding block acting on the contact region reduces the contact resistance between the graphite sliding block and the flat head electrode. Another such method involves the use of a two-part electrode. The two-part electrode includes a first half and a second half for compressing the socket. A spring element is coupled to the first half and the second half of the two-part electrode for providing a force to compress the socket. Another such method involves the use of an electrode defining a cup with the contact region located within a portion of the cup. The socket is adapted to fit into the cup of the electrode and to contact the contact region located within the cup of the electrode. Alternatively, the electrode may define the contact region on an outer surface thereof without defining a cup, and the socket may be structured as a cap that fits over the top of the electrode for contacting the contact region located on the outer surface of the electrode.

A fouling of the electrode occurs on the exterior surface of the electrode outside of the contact region on the portion of the electrode that is disposed within the chamber due to the buildup of deposits. The deposits result in an improper fit between the socket and the electrode over time. The improper fit causes small electrical arcs between the contact region and the socket that result in metal contamination of the material deposited on the carrier body. The metal contamination reduces the value of the carrier body as the material deposited is less pure. Additionally, the fouling reduces the heat transfer between the electrode and the socket resulting in the electrode reaching higher temperatures to effectively heat the socket and ultimately the carrier body. The higher temperatures of the electrode result in accelerated deposition of the material on the electrode. This is especially the case for electrodes that comprise silver or copper as the sole or main metal present therein.

Additionally, a fouling of the electrode occurs on the exterior surface of the electrode, on the portion of the exterior surface that is outside of the chamber. Such fouling is different from the type of fouling that occurs on the portion of the electrode that is disposed within the chamber, which is attributable to the material used for deposition. The fouling of the exterior surface of the electrode that is outside of the chamber may be caused by industrial conditions outside of the manufacturing apparatus, or may merely be attributable to oxidation due to the exposure of the electrode to air. This is especially the case for electrodes that comprise silver or copper as the sole or main metal present therein.

The electrode must be replaced when one or more of the following conditions occur: first, when the metal contamination of the material being deposited upon the carrier body exceeds a threshold level; second, when fouling of the exterior surface of the electrode in the chamber causes the connection between the electrode and the socket to become poor; and third, when excessive operating temperatures for the electrode are required due to deposition of the material on the electrode. The electrode has a life determined by the number of the carrier bodies the electrode can produce before one of the above occurs.

In view of the foregoing problems related to fouling of the electrode, there remains a need to at least delay the fouling of the electrode to improve the productivity of the electrode and to thereby increase useful life of the electrode.

SUMMARY OF THE INVENTION AND ADVANTAGES

The present invention relates to a manufacturing apparatus for deposition of a material on a carrier body and an electrode for use with the manufacturing apparatus. The carrier body has a first end and a second end spaced from each other. A socket is disposed at each of the ends of the carrier body.

The manufacturing apparatus includes a housing that defines a chamber. An inlet is defined through the housing for introducing a gas into the chamber. An outlet is defined through the housing for exhausting the gas from the chamber. At least one electrode is disposed through the housing with the electrode at least partially disposed within the chamber for coupling to the socket. The electrode has an exterior surface having a contact region that is adapted to contact the socket. An exterior coating is disposed on the exterior surface of the electrode, outside of the contact region. The exterior coating has an electrical conductivity of at least $9 \times 10^6$ Siemens/meter and corrosion resistance that is higher than silver in a galvanic series that is based upon room temperature sea water as an electrolyte. A power supply device is coupled to the electrode for providing an electrical current to the electrode.

There are many advantages to controlling the type and location of exterior coating on the exterior surface of the electrode. One advantage is that it is possible to delay fouling of the electrode by tailoring the exterior coating on the exterior surface of the electrode in various regions thereof with different materials based on the source of fouling. By delaying fouling, the life of the electrode is extended, resulting in a lower production cost and reducing the production time of the processed carrier bodies. Further, considerations with regard to electrical conductivity are of lesser importance outside of the contact region on the exterior surface as compared to within the contact region, thereby providing an opportunity for the exterior coating outside of the contact region to be open to more options with regard to the type of metal that may be included therein.

BRIEF DESCRIPTION OF THE DRAWINGS

Other advantages of the present invention will be readily appreciated, as the same becomes better understood by reference to the following detailed description when considered in connection with the accompanying drawings wherein:

FIG. 2 is a perspective view of an electrode utilized with the manufacturing apparatus of FIG. 1;

FIG. 3 is a cross-sectional view of the electrode of FIG. 2 taking along line 3-3 in FIG. 2;

DETAILED DESCRIPTION OF THE INVENTION

Figure 1:
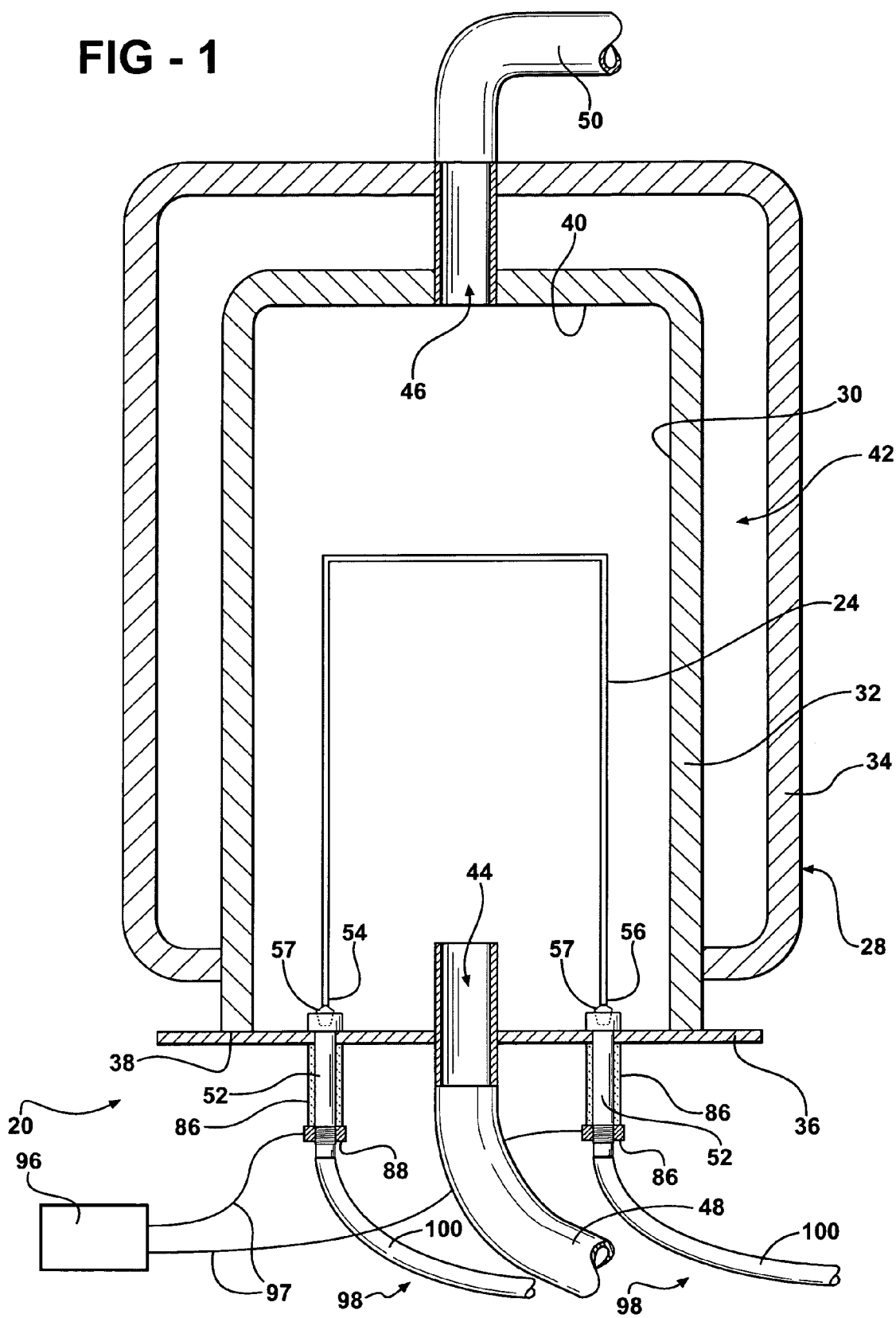
FIG. 1 is a cross-sectional view of a manufacturing apparatus for depositing a material on a carrier body.

Referring to the Figures, wherein like numerals indicate like or corresponding parts throughout the several views, a manufacturing apparatus 20 for deposition of a material 22 on a carrier body 24 is shown in FIGS. 1 and 6. In one embodiment, the material 22 to be deposited is silicon; however, it is to be appreciated that the manufacturing apparatus 20 can be used to deposit other materials on the carrier body 24 without deviating from the scope of the subject invention.

Typically, with methods of chemical vapor deposition known in the art, such as the Siemens method, the carrier body 24 is substantially U-shaped and has a first end 54 and a second end 56 spaced and parallel to each other. A socket 57 is disposed at each of the first end 54 and the second end 56 of the carrier body 24.

The manufacturing apparatus 20 includes a housing 28 that defines a chamber 30. Typically, the housing 28 comprises an interior cylinder 32, an outer cylinder 34, and a base plate 36. The interior cylinder 32 includes an open end 38 and a closed end 40 spaced from each other. The outer cylinder 34 is disposed about the interior cylinder 32 to define a void 42 between the interior cylinder 32 and the outer cylinder 34, typically serving as a jacket to house a circulated cooling fluid (not shown). It is to be appreciated by those skilled in the art that the void 42 can be, but is not limited to, a conventional vessel jacket, a baffled jacket, or a half-pipe jacket.

The base plate 36 is disposed on the open end 38 of the interior cylinder 32 to define the chamber 30. The base plate 36 includes a seal (not shown) disposed in alignment with the interior cylinder 32 for sealing the chamber 30 once the interior cylinder 32 is disposed on the base plate 36. In one embodiment, the manufacturing apparatus 20 is a Siemens type chemical vapor deposition reactor.

The housing 28 defines an inlet 44 for introducing a gas 45 into the chamber 30 and an outlet 46 for exhausting the gas 45 from the chamber 30. Typically, an inlet pipe 48 is connected to the inlet 44 for delivering the gas 45 to the housing 28 and an exhaust pipe 50 is connected to the outlet 46 for removing the gas 45 from the housing 28. The exhaust pipe 50 can be jacketed with a cooling fluid such as water or a commercial heat transfer fluid.

At least one electrode 52 is disposed through the housing 28 for coupling with the socket 57. In one embodiment, the at least one electrode 52 includes a first electrode 52 disposed through the housing 28 for receiving the socket 57 of the first end 54 of the carrier body 24 and a second electrode 52 disposed through the housing 28 for receiving the socket 57 of the second end 56 of the carrier body 24. It is to be appreciated that the electrode 52 can be any type of electrode known in the art such as, for example, a flat head electrode, a two-part electrode or a cup electrode. Further, the at least one electrode 52 is at least partially disposed within the chamber 30. In one embodiment, the electrode 52 is disposed through the base plate 36.

The electrode 52 comprises an electrically conductive material having a minimum electrical conductivity at room temperature of at least $14 \times 10^6$ Siemens/meter or S/m. For example, the electrode 52 can comprise at least one of copper, silver, nickel, Inconel and gold, each of which meets the conductivity parameters set forth above. Additionally, the electrode 52 can comprise an alloy that meets the conductivity parameters set forth above. Typically, the electrode 52 comprises electrically conductive material having a minimum electrical conductivity at room temperature of about $58 \times 10^6$ S/m. Typically, the electrode 52 comprises copper and the copper is typically present in an amount of about 100% by weight based on the weight of the electrode 52. The copper can be oxygen-free electrolytic copper grade UNS 10100.

Referring also to FIGS. 2 and 3, the electrode 52 has an exterior surface 60. The exterior surface 60 of the electrode 52 has a contact region 80. In particular, the contact region 80 as defined herein is the portion of the exterior surface 60 of the electrode 52 that is adapted to be in direct contact with the socket 57 and that provides a primary current path from the electrode 52 to the socket 57 and into the carrier body 24. As such, during normal operation of the manufacturing apparatus 20, the contact region 80 is shielded from exposure to the material 22 that is deposited on the carrier body 24. Because the contact region 80 is adapted to be in direct contact with the socket 57 and is generally not exposed to the material 22 during deposition on the carrier body 24, the contact region 80 is subject to different design considerations than other portions of the electrode 52, which considerations are described in further detail below.

In one embodiment, the electrode 52 includes a shaft 58 having a first end 61 and a second end 62. When present, the shaft 58 further defines the exterior surface 60 of the electrode 52. Generally, the first end 61 is an open end of the electrode 52. In one embodiment, the shaft 58 has a circular cross sectional shape resulting in a cylindrically-shaped shaft and defines a diameter $D_1$. However, it is to be appreciated that the shaft 58 can have a rectangular, a triangular, or an elliptical cross sectional shape without deviating from the subject invention.

The electrode 52 can also include a head 72 disposed on one of the ends 61, 62 of the shaft 58. It is to be appreciated that the head 72 can be integral to the shaft 58. Typically, when the head 72 is present, the head 72 further defines the exterior surface 60 having the contact region 80. It is to be appreciated by those skilled in the art that the method of connecting the socket 57 to the electrode 52 can vary between applications without deviating from the subject invention. For example, in one embodiment, such as for flat head electrodes (not shown), the contact region can merely be a top, flat surface on the head 72 of the electrode 52 and the socket 57 can define a socket cup (not shown) that fits over the head 72 of the electrode 52 for contacting the contact region. Alternatively, although not shown, the head 72 may be absent from the ends 61, 62 of the shaft 58. In this embodiment, the electrode 52 may define the contact region on the exterior surface 60 of the shaft 58, and the socket 57 may be structured as a cap that fits over the shaft 58 of the electrode 52 for contacting the contact region 80 located on the exterior surface 60 of the shaft 58.

Figure 4:
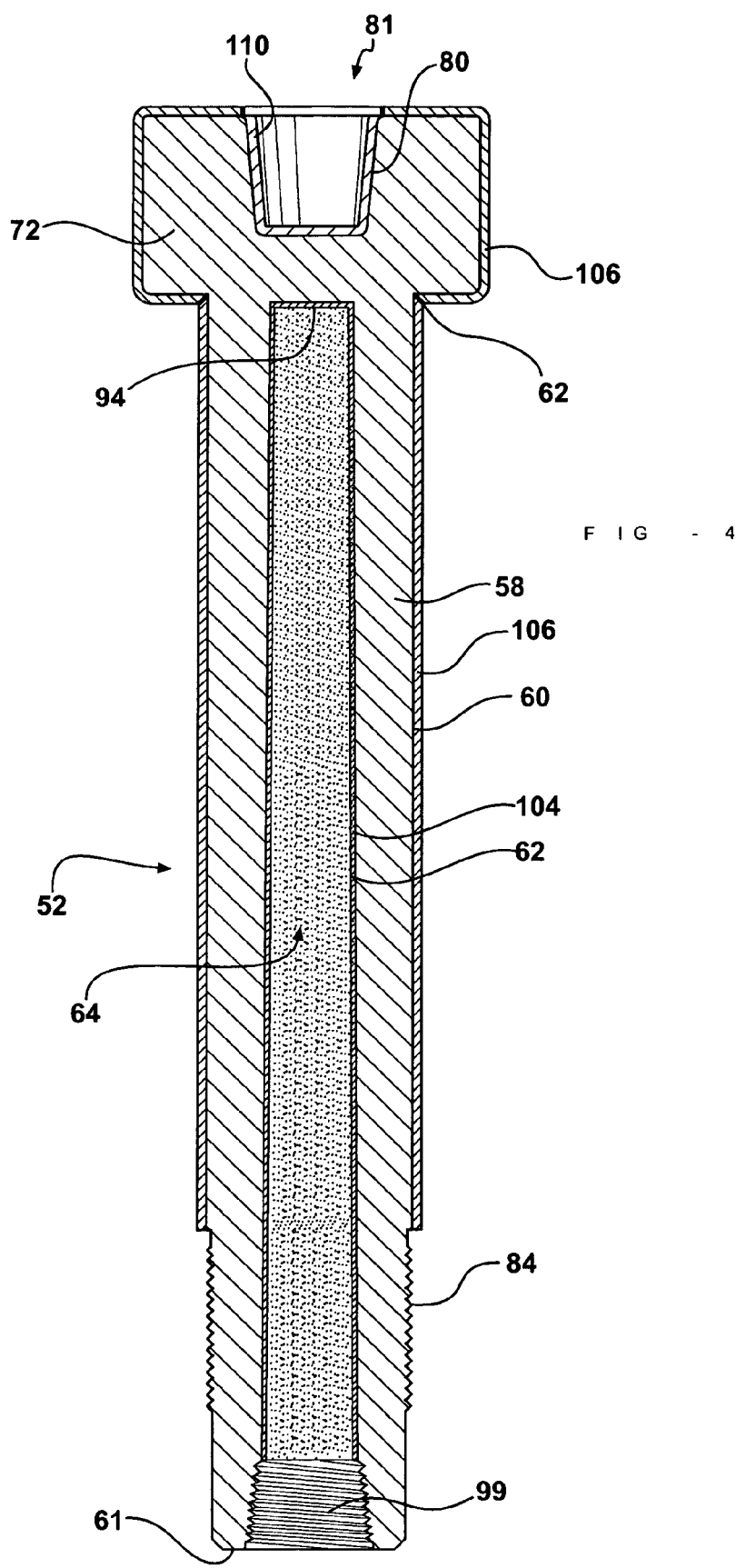
FIG. 4 is a cross-sectional view of the electrode of FIG. 3 showing an exterior coating on the exterior surface thereof.

In another embodiment, as shown in FIGS. 2-4, the electrode 52 defines a cup 81 for receiving the socket 57. When the electrode 52 defines the cup 81, the contact region 80 is located within a portion of the cup 81. The socket 57 and the cup 81 can be designed such that the socket 57 can be removed from the electrode 52 when the carrier body 24 is harvested from the manufacturing apparatus 20. Typically, the head 72 defines a diameter $D_2$ that is greater than the diameter $D_1$ of the shaft 58. The base plate 36 defines a hole (not numbered) for receiving the shaft 58 of the electrode 52 such that the head 72 of the electrode 52 remains within the chamber 30 for sealing the chamber 30. It is to be appreciated that the head 72 can be integral to the shaft 58.

A first set of threads 84 can be disposed on the exterior surface 60 of the electrode 52. Referring back to FIGS. 1 and 6, a dielectric sleeve 86 is typically disposed around the electrode 52 for insulating the electrode 52. The dielectric sleeve 86 can comprise a ceramic. A nut 88 is disposed on the first set of threads 84 for compressing the dielectric sleeve 86 between the base plate 36 and the nut 88 to secure the electrode 52 to the housing 28. It is to be appreciated that the electrode 52 can be secured to the housing 28 by other methods, such as by a flange, without deviating from the scope of the subject invention.

Referring back to FIGS. 2 through 4, typically, at least one of the shaft 58 and the head 72 include an interior surface 62 defining the channel 64. The interior surface 62 includes a terminal end 94 spaced from the first end 61 of the shaft 58. The terminal end 94 is generally flat and parallel to the first end 61 of the electrode 52. It is to be appreciated that other configurations of the terminal end 94 can be utilized such as a cone-shaped configuration, an ellipse-shaped configuration, or an inverted cone-shaped configuration (none of which are shown). The channel 64 has a length L that extends from the first end 61 of the electrode to the terminal end 94. It is to be appreciated that the terminal end 94 can be disposed within the shaft 58 of the electrode 52 or the terminal end 94 can be disposed within the head 72 of the electrode, when present, without deviating from the subject invention.

Referring again to FIGS. 1 and 6, the manufacturing apparatus 20 further includes a power supply device 96 coupled to the electrode 52 for providing an electrical current to the electrode 52. Typically, an electric wire or cable 97 couples the power supply device 96 to the electrode 52. In one embodiment, the electric wire 97 is connected to the electrode 52 by disposing the electric wire 97 between the first set of threads 84 and the nut 88. It is to be appreciated that the connection of the electric wire 97 to the electrode 52 can be accomplished by different methods.

The electrode 52 has a temperature, which is modified by passage of the electrical current there through, resulting in a heating of the electrode 52 and thereby establishing an operating temperature of the electrode. Such heating is known to those skilled in the art as Joule heating. In particular, the electrical current passes through the electrode 52, through the socket 57 and into the carrier body 24 resulting in the Joule heating of the carrier body 24. Additionally, the Joule heating of the carrier body 24 results in a radiant/convective heating of the chamber 30. The passage of electrical current through the carrier body 24 establishes an operating temperature of the carrier body 24.

Figure 4A:
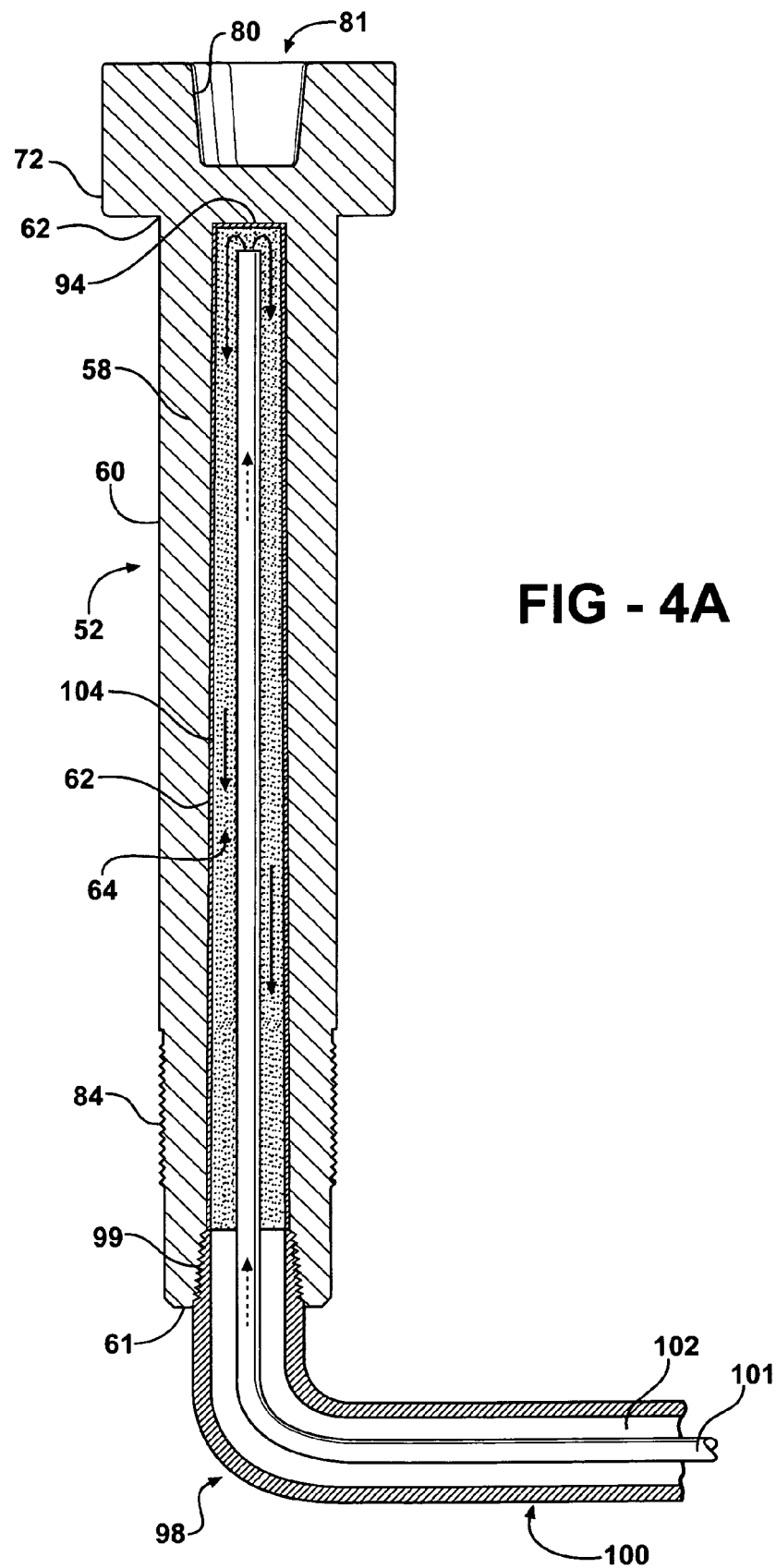
FIG. 4A is a cross-sectional view of the electrode of FIG. 3 with a portion of a circulation system connected thereto.
Figure 5:
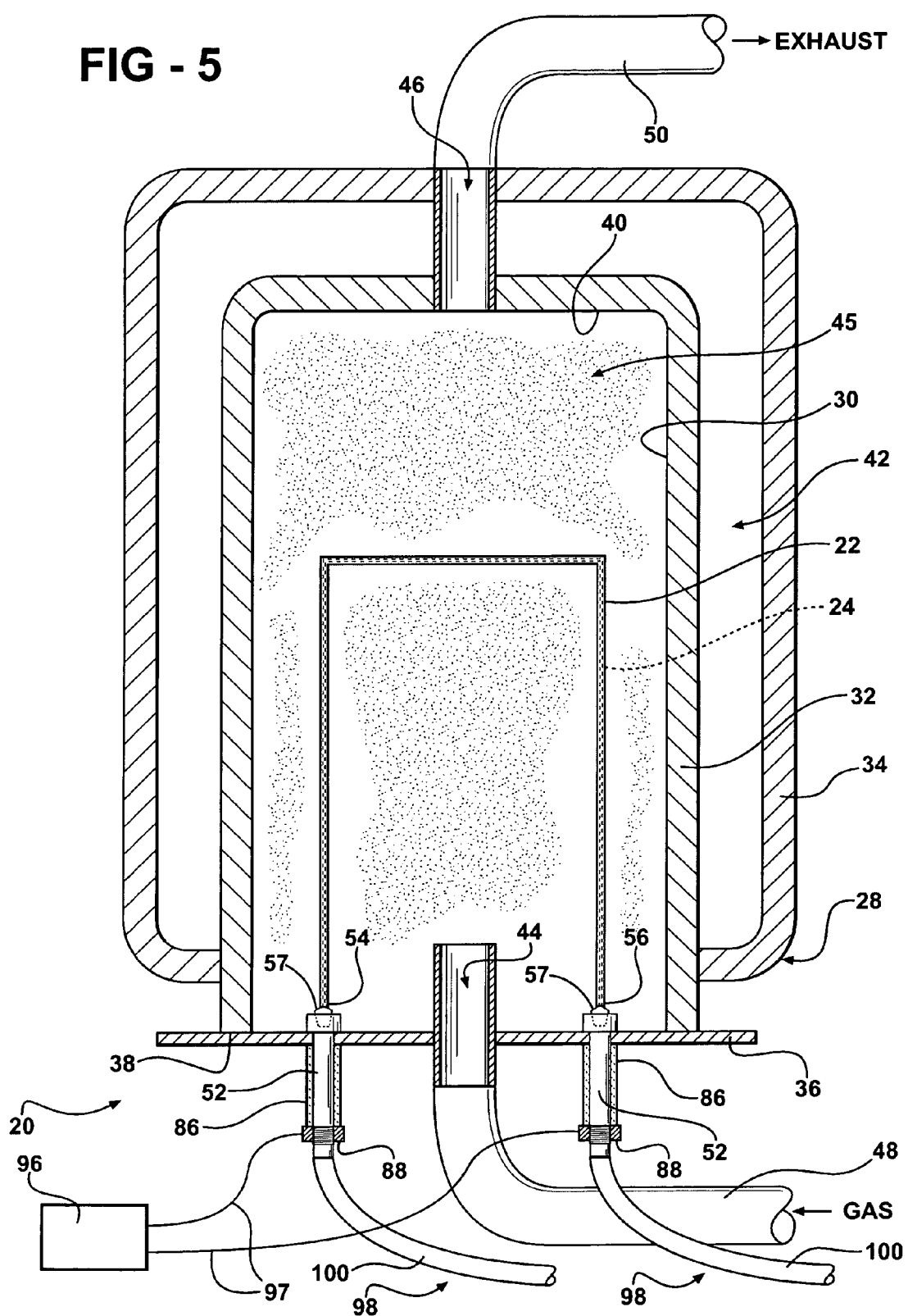
FIG. 5 is a cross-sectional view of the manufacturing apparatus of FIG. 1 during the deposition of the material on the carrier body.

Referring to FIG. 4A and back to FIGS. 1 and 5, the manufacturing apparatus 20 can also include a circulating system 98 disposed within the channel 64 of the electrode 52. When present, the circulating system 98 is at least partially disposed within the channel 64. It is to be appreciated that a portion of the circulating system 98 can be disposed outside the channel 64. A second set of threads 99 can be disposed on the interior surface 62 of the electrode 52 for coupling the circulating system 98 to the electrode 52. However, it is to be appreciated by those skilled in the art that other fastening methods, such as use of flanges or couplings, can be used to couple the circulating system 98 to the electrode.

The circulating system 98 includes a coolant in fluid communication with the channel 64 of the electrode 52 for reducing the temperature of the electrode 52. In one embodiment, the coolant is water; however, it is to be appreciated that the coolant can be any fluid designed to reduce heat through circulation without deviating from the subject invention. Moreover, the circulating system 98 also includes a hose 100 coupled between the electrode 52 and a reservoir (not shown). Referring only to FIG. 4A, the hose 100 includes an inner tube 101 and an outer tube 102. It is to be appreciated that the inner tube 101 and the outer tube 102 can be integral to the hose 100 or, alternatively, the inner tube 101 and the outer tube 102 can be attached to the hose 100 by utilizing couplings (not shown). The inner tube 101 is disposed within the channel 64 and extends a majority of the length L of the channel 64 for circulating the coolant within the electrode 52.

The coolant within the circulating system 98 is under pressure to force the coolant through the inner tube 101 and the outer tubes 102. Typically, the coolant exits the inner tube 101 and is forced against the terminal end 94 of the interior surface 62 of the electrode 52 and subsequently exits the channel 64 via the outer tube 102 of the hose 100. It is to be appreciated that reversing the flow configuration such that the coolant enters the channel 64 via the outer tube 102 and exits the channel 64 via the inner tube 101 is also possible. It is also to be appreciated by those skilled in the art of heat transfer that the configuration of the terminal end 94 influences the rate of heat transfer due to the surface area and proximity to the head 72 of the electrode 52. As set forth above, the different geometric contours of the terminal end 94 result in different convective heat transfer coefficients for the same circulation flow rate.

Referring to FIG. 4, the electrode 52 includes an exterior coating 106 disposed on the exterior surface 60 thereof outside of the contact region 80. In particular, the exterior coating 106 is typically disposed on at least one of the head 72, outside of the contact region 80, and the shaft 58 of the electrode 52. Stated differently, the exterior coating 106 may be disposed on the head 72 outside of the contact region 80, on the shaft 58, or on both the head 72 outside of the contact region 80 and on the shaft 58. When included on the shaft 58, the exterior coating 106 may extend from the head 72 to the first set of threads 84 on the shaft 58. The exterior coating 106 has an electrical conductivity of at least $9 \times 10^6$ S/m, more typically at least 20 S/m, most typically at least 40 S/m, and a corrosion resistance higher than silver in a galvanic series based upon room temperature seawater as an electrolyte. Such galvanic series tests are well known in the art. Due to a lesser importance of electrical conductivity for the exterior coating 106 than for the electrode 52 itself, and because the exterior coating 106 is not intended to be in contact with the carrier body 24 during deposition, a wider range of materials may be used for the exterior coating 106 than can be used for portions of the electrode 52 that are intended to be in contact with the carrier body 24. Further, because a wider range of materials satisfy the electrical conductivity requirements for the exterior coating 106 than for the portions of the electrode 52 that are intended to be in contact with the socket 57, materials can be chosen that are more resistant to corrosion and, thus, foul at a slower rate than the materials used for the electrode 52 itself. The slower fowling provides advantages relative to increasing the life of the electrode 52.

The specific type of material used for the exterior coating 106 may depend upon the specific location of the exterior coating 106. For example, the source of corrosion and, thus, fouling may be different depending upon the specific location of the exterior coating 106. When the exterior coating 106 is disposed on the exterior surface 60 of the head 72 outside of the contact region 80, the exterior coating 106 is disposed within the chamber 30 and, thus, is exposed to the material 22 that is used to deposit on the carrier body 24. Under such circumstances, it may be desirable for the exterior coating 106 to provide resistance to corrosion in a chloride environment during the harvesting of polycrystalline silicon and to further provide resistance to chemical attack via chlorination and/or silicidation as a result of exposure to the material 22 that is used during the deposition process. Suitable metals that may be used for the exterior coating 106 on the head 72 of the electrode 52 outside of the contact region 80 include gold, platinum, and palladium. Typically, the exterior coating 106 comprises gold due to an excellent combination of electrical conductivity and resistance to corrosion from various sources. The exterior coating 106 may include other metals so long as at least one of gold, platinum, and palladium are included in the exterior coating 106. For example, in one embodiment, the exterior coating 106 may further include at least one of silver, nickel, and chromium, such as a nickel/silver alloy. Typically, the exterior coating 106 includes substantially only gold, platinum, and/or palladium. However, when one or more of the other metals are present, the total amount of gold, platinum, and palladium is typically at least 50% by weight based on the total weight of the exterior coating 106. When the exterior coating 106 is disposed on the exterior surface 60 of the shaft 58, the exterior coating 106 may include the same or different metals from those included in the exterior coating 106 on the head 72 outside of the contact region 80. In one embodiment, the exterior coating 106 on the shaft 58 includes different materials from the exterior surface 60 of the head 72, thereby allowing the exterior coating 106 on the shaft 58 to be tailored to resist corrosion from different sources than the cause of corrosion on the exterior surface 60 of the head 72. In another embodiment, the shaft 72 may be free from a coating disposed on the exterior surface 60 thereof. In yet another embodiment, the exterior surface 60 of the head may be free from a coating, with the exterior coating 106 only disposed on the exterior surface 60 of the shaft 58.

The exterior coating 106 typically has a thickness of from 0.0254 mm to 0.254 mm, more typically from 0.0508 mm to 0.254 mm and most typically from 0.127 mm to 0.254 mm.

The electrode 52 can be coated in other locations other than the exterior surface 60 for extending the life of the electrode 52. Referring to FIGS. 2 through 4, a channel coating 104 may be disposed on the interior surface 62 of the electrode 52 for maintaining the thermal conductivity between the electrode 52 and the coolant. Generally, the channel coating 104 has a higher resistance to corrosion that is caused by the interaction of the coolant with the interior surface 62 as compared to the resistance to corrosion of the electrode 52. The channel coating 104 typically includes a metal that resists corrosion and that inhibits buildup of deposits. For example, the channel coating 104 can comprise at least one of silver, gold, nickel, and chromium. Typically, the channel coating 104 is nickel. The channel coating 104 has a thermal conductivity of from 70.3 to 427 W/m K, more typically from 70.3 to 405 W/m K and most typically from 70.3 to 90.5 W/m K. The channel coating 104 also has a thickness of from 0.0025 mm to 0.026 mm, more typically from 0.0025 mm to 0.0127 mm and most typically from 0.0051 mm to 0.0127 mm.

Additionally, it is to be appreciated that the electrode 52 may further include an anti-tarnishing layer disposed on the channel coating 104. The anti-tarnishing layer is a protective thin film organic layer that is applied on top of the channel coating 104. Protective systems such as Technic Inc.'s Tarniban™ can be used following the formation of the channel coating 104 of the electrode 52 to reduce oxidation of the metal in the electrode 52 and in the channel coating 104 without inducing excessive thermal resistance. For example, in one embodiment, the electrode 52 can comprise silver and the channel coating 104 can comprise silver with the anti-tarnishing layer present for providing enhanced resistance to the formation of deposits compared to pure silver. Typically, the electrode 52 comprises copper and the channel coating 104 comprises nickel for maximizing thermal conductivity and resistance to the formation of deposits, with the anti-tarnishing layer disposed on the channel coating 104.

Without being bound by theory, the delay of fouling attributed to the presence of the channel coating 104 extends the life of the electrode 52. Increasing the life of the electrode 52 decreases production cost as the electrode 52 needs to be replaced less often as compared to electrodes 52 without the channel coating 104. Additionally, the production time to deposit the material 22 on the carrier body 24 is also decreased because replacement of electrodes 52 is less frequent compared to when electrodes 52 are used without the channel coating 104. The channel coating 104 results in less down time for the manufacturing apparatus 20.

In one embodiment, the electrode 52 includes a contact region coating 110 disposed on the contact region 80 of the electrode 52. The contact region coating 110 generally comprises a metal. For example, the contact region coating 110 can comprise at least one of silver, gold, nickel, and chromium. Typically, the contact region coating 110 comprises nickel or silver. The contact region coating 110 has a thickness of from 0.00254 to 0.254 mm, more typically from 0.00508 mm to 0.127 mm and most typically from 0.00508 mm to 0.0254 mm. Selection of the specific type of metal can depend on the chemical nature of the gas, thermal conditions in the vicinity of the electrode 52 due to a combination of the temperature of the carrier body 24, current flowing through the electrode 52, cooling fluid flow rate, and cooling fluid temperature may all influence the choice of metals used for various sections of the electrode. For instance, when the exterior coating 106 is disposed on the head 72 outside of the contact region 80, the exterior coating 106 can comprise nickel or chromium due to chlorination resistance while the use of silver for the contact region coating 110 may be chosen for silicidation resistance over natural resistance to chloride attack. Further, because silver is more electrically conductive than nickel or chromium, the silver may be more appropriate for the contact region coating 110 than nickel or chromium whereas electrical conductivity is of lesser importance outside of the contact region 80.

The contact region coating 110 also provides improved electrical conduction and minimizes a copper silicide buildup within the contact region 80. The copper silicide buildup prevents a proper fit between the socket 57 and the contact region 80 which can lead to a pitting of the socket 57. The pitting causes small electric arcs between the contact region 80 and socket 57 that results to metal contamination of the polycrystalline silicon product.

It is to be appreciated that the electrode 52 can have at least one of the channel coating 104 and the contact region coating 110 in any combination in addition to the exterior coating 106. The channel coating 104, the exterior coating 106, and the contact region coating 110 can be formed by electroplating. However, it is to be appreciated that the each of the coatings can be formed by different methods without deviating from the subject invention. Also, it is to be appreciated by those skilled in the art of manufacturing high purity semiconductor materials, such as polycrystalline silicon, that some plating processes utilize materials that are dopants, e.g. Group III and Group V elements (excluding nitrogen for the case of manufacturing polycrystalline silicon), and choice of the appropriate coating method can minimize the potential contamination of the carrier body 24. For example, it is desired that areas of the electrode typically disposed within the chamber 32, such as the head coating 108 and the contact region coating 110, have minimal boron and phosphorous incorporation in their respective electrode coatings.

A typical method of deposition of the material 22 on the carrier body 24 is discussed below and refers to FIG. 6. The carrier body 24 is placed within the chamber 30 such that the sockets 57 disposed at the first end 54 and the second end 56 of the carrier body 24 are disposed within the cup 81 of the electrode 52 and the chamber 30 is sealed. The electrical current is transferred from the power supply device 96 to the electrode 52. A deposition temperature is calculated based on the material 22 to be deposited. The operating temperature of the carrier body 24 is increased by direct passage of the electrical current to the carrier body 24 so that the operating temperature of the carrier body 24 exceeds the deposition temperature. The gas 45 is introduced into the chamber 30 once the carrier body 24 reaches the deposition temperature. In one embodiment, the gas 45 introduced into the chamber 30 comprises a halosilane, such as a chlorosilane or a bromosilane. The gas can further comprise hydrogen. However, it is to be appreciated that the instant invention is not limited to the components present in the gas and that the gas can comprise other deposition precursors, especially silicon containing molecular such as silane, silicon tetrachloride, and tribromosilane. In one embodiment, the carrier body 24 is a silicon slim rod and the manufacturing apparatus 20 can be used to deposit silicon thereon. In particular, in this embodiment, the gas typically contains trichlorosilane and silicon is deposited onto the carrier body 24 as a result of the thermal decomposition of trichlorosilane. The coolant is utilized for preventing the operating temperature of the electrode 52 from reaching the deposition temperature to ensure that silicon is not deposited on the electrode 52. The material 22 is deposited evenly onto the carrier body 24 until a desired diameter of material 22 on the carrier body 24 is reached.

Once the carrier body 24 is processed, the electrical current is interrupted so that the electrode 52 and the carrier body 24 stop receiving the electrical current. The gas 45 is exhausted through the outlet 46 of the housing 28 and the carrier body 24 is allowed to cool. Once the operating temperature of the processed carrier body 24 has cooled the processed carrier body 24 can be removed from the chamber 30. The processed carrier body 24 is then removed and a new carrier body 24 is placed in the manufacturing apparatus 20.

Obviously, many modifications and variations of the present invention are possible in light of the above teachings. The foregoing invention has been described in accordance with the relevant legal standards; thus, the description is exemplary rather than limiting in nature. Variations and modifications to the disclosed embodiment may become apparent to those skilled in the art and do come within the scope of the invention. Accordingly, the scope of legal protection afforded this invention may only be determined by studying the following claims.

What is claimed is:

1. A manufacturing apparatus for deposition of a material on a carrier body having a first end and a second end spaced from each other with a socket disposed at each end of the carrier body, said apparatus comprising:
    a housing defining a chamber;
    an inlet defined through said housing for introducing a gas into the chamber;
    an outlet defined through said housing for exhausting the gas from the chamber;
    at least one electrode having an exterior surface having a contact region adapted to contact the socket, said electrode disposed through said housing with said electrode at least partially disposed within the chamber for coupling with the socket, wherein said electrode defines a cup with said contact region located within a portion of said cup;
    a power supply device coupled to said electrode for providing an electrical current to said electrode;
    an exterior coating disposed on said exterior surface of said electrode outside of said contact region, said exterior coating having an electrical conductivity of at least $9 \times 10^6$ Siemens/meter and corrosion resistance higher than silver in a galvanic series based upon room temperature seawater as an electrolyte; and
    a contact region coating disposed on the contact region and comprising a single, uniform composition that is distinct from the exterior coating, the contact region coating consisting of silver.

2. A manufacturing apparatus as set forth in claim 1 wherein said electrode further includes:
    a shaft having a first end and a second end; and
    a head disposed on one of said ends of said shaft.

3. A manufacturing apparatus as set forth in claim 2 wherein said head of said electrode defines said exterior surface having said contact region.

4. A manufacturing apparatus as set forth in claim 3 wherein said exterior coating is disposed on at least one of said head outside of said contact region and said shaft.

5. A manufacturing apparatus as set forth in claim 4 wherein said exterior coating is disposed on said head outside of said contact region.

6. A manufacturing apparatus as set forth in claim 5 wherein said exterior coating is further disposed on said shaft of said electrode and wherein said exterior coating on said shaft includes different metals from said exterior coating on said head.

7. A manufacturing apparatus as set forth in claim 2 wherein said shaft is free from a coating disposed on said exterior surface thereof.

8. A manufacturing apparatus as set forth in claim 2 wherein said head comprises copper.

9. A manufacturing apparatus as set forth in claim 2 wherein said head of said electrode is at least partially disposed within the chamber.

10. A manufacturing apparatus as set forth in claim 1 wherein said exterior coating comprises at least one of gold, platinum, and palladium.

11. A manufacturing apparatus as set forth in claim 10 wherein said exterior coating has a thickness of from 0.0254 to 0.254 mm.

12. A manufacturing apparatus as set forth in claim 1 wherein said at least one electrode includes a first electrode for receiving the socket at the first end of the carrier body and a second electrode for receiving the socket at the second end of the carrier body.

13. A manufacturing apparatus as set forth in claim 1 wherein said contact region coating has a thickness of from 0.0254 mm to 0.254 mm.

* * * * *